United States Patent

Kuth

[11] Patent Number: 6,034,576
[45] Date of Patent: Mar. 7, 2000

[54] LINE COUPLING ASSEMBLY GUIDING ELECTRICAL SIGNALS INTO A HIGH-FREQUENCY SHIELDED AREA

[75] Inventor: Rainer Kuth, Herzogenaurach, Germany

[73] Assignee: Siemens Aktiengesellschaft, Munich, Germany

[21] Appl. No.: 09/153,059

[22] Filed: Sep. 15, 1998

[30] Foreign Application Priority Data

Sep. 22, 1997 [DE] Germany .............................. 197 41 746

[51] Int. Cl.[7] ...................................... H03H 1/00
[52] U.S. Cl. ......................... 333/101; 174/261; 361/781; 333/12; 333/24 R
[58] Field of Search ..................................... 333/101, 105, 333/12, 24 R; 361/816, 818, 781; 174/50.59, 50.6, 261, 267

[56] References Cited

U.S. PATENT DOCUMENTS 3,829,801  8/1974  Priestly et al. ........................... 333/101
5,136,471  8/1992  Inasaka ............................... 174/261 X

FOREIGN PATENT DOCUMENTS 2820002    11/1979  Germany .............................. 174/267
OS 195 16
  641      11/1996  Germany .

Primary Examiner—Paul Gensler
Attorney, Agent, or Firm—Hill & Simpson

[57] ABSTRACT

A line coupling assembly contains a carrier plate of an electrically insulating material with first and second opposite surfaces. A first electrically conductive layer at least partially covers the first surface. A first line section is arranged on the first surface so as to be electrically insulated from the first layer. A second electrically conductive layer at least partially covers the second surface. A second line section is arranged on the second surface so as to be electrically insulated from the second layer. A line segment runs from the first surface to the second surface. First and second switches for bilateral electrical connection of the line segment to the first and second layers or to the first and second line sections are arranged on the first and the second surfaces, respectively.

5 Claims, 1 Drawing Sheet

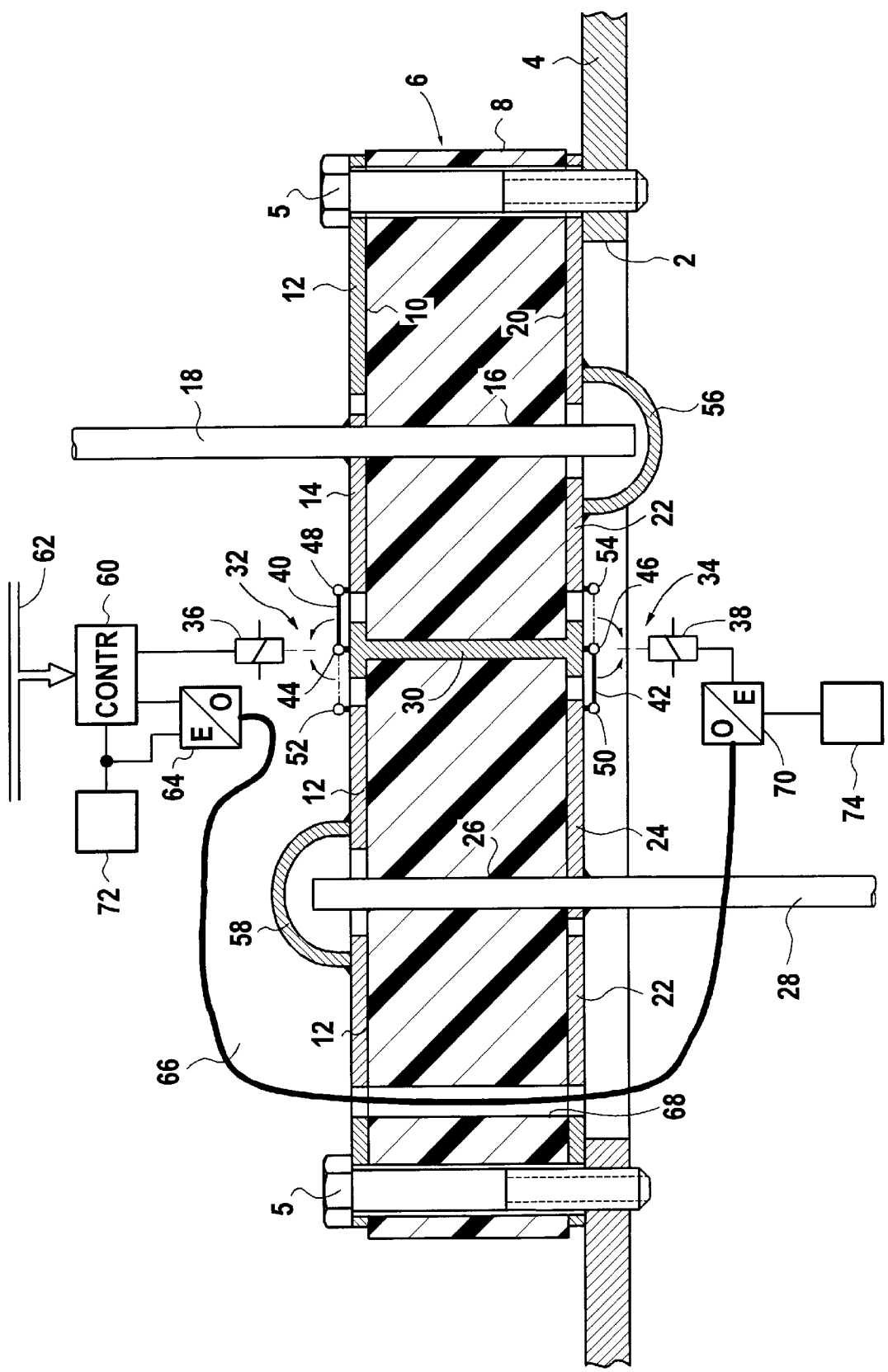

LINE COUPLING ASSEMBLY GUIDING ELECTRICAL SIGNALS INTO A HIGH-FREQUENCY SHIELDED AREA

BACKGROUND OF THE INVENTION

1. Field of the Invention

The present invention relates to a line coupling assembly for guiding electrical signals into a high-frequency shielded area such as a room, chamber, cabinet or the like.

2. Description of the Prior Art

In general, high-frequency devices generate disturbances in operation which make a shielding of the device necessary. Conversely, there are devices which are sensitive to external disturbances and which have to be shielded from such disturbances to function perfectly. Specifically, MR (magnetic resonance) devices need to be provided with a high-frequency shielding in order to prevent high-frequency signals generated by the MR device as disturbing signals from penetrating to the outside of the device, and also to shield the sensitive high-frequency receiving channel of the MR device from outside disturbances. If additional devices are operated within the high-frequency shielding chamber besides the MR device, then signal lines and/or power supply lines need to be led into the high-frequency chamber for these devices. Hollow conductor feed-throughs or bushings are known which are dimensioned as high-pass filters such that the lower limit frequency of the hollow conductor feed-through lies far above the operating frequency of the MR device. Light waveguides or plastic tubes, e.g. compressed air lines for pneumatic systems, can be fed through the hollow conductor feed-throughs, for example. Additionally, feed-through filters for quasi-static or low-frequency signals are known which have a very high attenuation in the region of the operating frequency of the MR device.

A sufficient shielding effect in the frequency region of interest is not always possible. For optical position measuring systems where there is cyclical firing of light-emitting diodes with a high pulse energy, for example, there is no suitable signal feed-through into the high-frequency shielding chamber. There is also no known practicable technical solution for high-frequency therapy devices which allows operation of such a device immediately next to the MR device in the high-frequency shielding chamber.

German OS 195 16 641 discloses an assembly wherein the introduction of electrical lines into a high-frequency shielding is possible without prejudicing the operation of a high-frequency device arranged inside the high-frequency shielding. An external power supply is therein separated from the assembly during the measuring operation in the high-frequency shielding chamber by means of a change-over switch, and this power supply is connected to a reference potential. The assembly is powered with electrical energy via electronic elements during this time. During the measuring pauses the assembly is connected to the external power supply.

SUMMARY OF THE INVENTION

An object of the present invention to provide a line coupling assembly with which a feed-through of electrical lines into a high-frequency shielding is achieved without prejudicing the operation of a high-frequency device arranged inside the high-frequency shielding.

This object is inventively achieved in a line coupling assembly having a carrier plate of an electrically insulating material with first and second opposite surfaces, a first electrically conductive layer at least partially covering the first surface, a first line section arranged on the first surface so as to be electrically insulated from the first layer, a second electrically conductive layer at least partially covering the second surface, a second line section arranged on the second surface so as to be electrically insulated from the second layer, a line segment running from the first to the second surface, and first and second switches electrically connecting the line segment with the first and second layers or with the first and second line sections, these switches being arranged on the first and second surfaces, respectively. The feed-through of the line occurs via the line sections, the switches and the line segment. An auxiliary device is thus connected to the line sections. It is thus possible within the high-frequency shielding to have an alternating operation of the actual high-frequency device with the auxiliary devices powered via the line coupling assembly. During the operation of the high-frequency device the line segment is connected to the electrically conductive layers via the switches, these layers being connected to a reference potential via the high-frequency shielding. During the operation of the auxiliary devices the line segment is connected to the devices which are connected to the line sections.

DESCRIPTION OF THE DRAWINGS

The single FIGURE is a sectional view through an exemplary embodiment of a line coupling assembly in accordance with the invention.

DESCRIPTION OF THE PREFERRED EMBODIMENTS

The FIGURE depicts—sectionally, in a side view—a line coupling assembly which is placed in an electrically conductive fashion in an opening 2 of a sidewall 4 of a high-frequency shielding chamber, room or cabinet (not depicted). The line coupling assembly completely covers the opening 2 in the sidewall 4 and is connected to the sidewall 4 every 3 mm with screws 5, for example. The line coupling assembly is constructed in the manner of a circuit board 6 that is plated on both sides. In typical fashion the circuit board 6 contains a carrier plate 8 of electrically insulating material. A first surface 10 of the carrier plate 8 is at least partially covered by a first electrically conductive layer 12. A first line section 14 is likewise arranged on the first surface 10 so as to be insulated from the first electrically conductive layer 12. The line section 14 is electrically connected to a first through-connection 16 in which a lead 18 is soldered to a line installed outside the high-frequency shielding chamber.

A second surface 20 of the carrier plate 8 opposite the first surface 10, is covered with a second electrically conductive layer 22. A second line section 24 is arranged on the second surface 20 so as to be insulated form the second electrically conductive layer 22. The second line section 24 is connected in an electrically conductive fashion to a second through-connection 26 in which another lead 28 is soldered which belongs to a line installed within the high-frequency shielding chamber. A line segment 30 extends through the carrier plate 8 from the first surface 10 to the second surface 20.

A first electrical switching arrangement is in the form of a first switch relay 32, and a second electrical switching arrangement is in the form of a second switch relay 34 for bilateral electrical connection of the line segment 30 to the first and second line sections 14 and 24, or to the first and second electrically conductive layers 12, 22. The switch relays 32, 34 respectively contain electromagnetic drives 36 and 38. The electromagnetic drives 36 and 38 respectively act on switch elements 40 and 42. The ends at the opposite side of the line segment 30 are respectively securely electrically connected to center terminals 44 and 46 of the switch elements 40 and 42. A break contact 48 of the switch element 40 is securely electrically connected to the first line section 14, and a break contact 50 of the second switch element 42 is securely electrically connected to the second line section 24. Furthermore a working contact 52 of the switch element 40 is securely electrically connected to the first electrically conductive layer 12, and a working contact 54 of the second switch element 42 is securely electrically connected to the second electrically conductive layer. In the normal position of the two switches elements 40 and 42 there is an electrically conductive connection from the center terminal 44 to the break contact 48 and from the center terminal 46 to the break contact 50. The lead 18 and the other lead 28 are thus connected in electrically conductive fashion through the carrier plate 8. Through actuation of the electromagnetic drives 36 and 38 the switch elements 40 and 42 switch states (positions), so that the center terminals 44 and 46 are electrically connected to the working contacts 52 and 54, respectively. In this operating position of the two relays 32 and 34, the first electrically conductive layer 12 is electrically connected to the second conductive layer 22 through the carrier plate 8, via the line segment 30 and the leads 18, 28 are electrically separated from one another.

To avoid the first through-connection 16 acting as an antenna for electrical disturbances, it is capped with a first cap 56 of conductive material, whereby the cap 56 being in electrical contact with the second electrically conductive layer 22. In similar fashion the second through-connection 26 to the outside of the shielding is capped with a second cap 58 of electrically conductive material, the second cap 58 being in electrical contact with the first electrically conductive layer 12. The actuation of the two relays 32 and 34 occurs in parallel fashion by signals from a controller 60 arranged outside the shielding and connected to a control bus 62. The first switch relay 32 is actuated directly by the controller 60. The actuation of the second switch relay 34 occurs via an optical signal transmission path. The optical signal transmission path contains an electro-optical converter 64 arranged outside the shielding which converts an electrical control signal generated by the controller 60 into an optical signal. A light waveguide 66 is fed through a through-hole 68 of the circuit board 6. The light waveguide 66 is optically coupled with the electro-optical converter 64 at one end and with an opto-electrical converter 70 at an opposite end, this latter converter 70 being arranged inside the shielding chamber. The opto-electrical converter 70 converts the optical signal into an electrical signal for the switch relay 34. A first power supply 72 outside the shielding supplies the switch relay 32, the controller 60 and the electro-optical converter 64 with electrical energy. The other switch relay 34 arranged inside the shielding and the appertaining opto-electrical converter 70 are powered by a power supply 74 arranged inside the shielding.

For clarity the line coupling assembly depicted in the figure shows a line coupling for a single switchable electrical connection from one side of the assembly to the other, or from the outside to the inside with respect to the shielding. Other electrical connections are of course realizable wherein the leads 18 and 28, the line segment 30 and the switch elements 40 and 42 are duplicated as many times as necessary.

One application of the line coupling assembly is to cyclically actuate electrical drive signals for optical transmitters arranged within the shielding chamber with high pulse energy. The pulse frequency for this purpose is about 50 Hz, depending on the number of the light-emitting diodes, while harmonic oscillations up to 500 MHZ are generated by the steep pulse rises. There are also harmonic oscillations in the range of the operating frequency of the MR device therein. The pulse transmitters for generating the electrical drive signals are then located outside the high-frequency shielding chamber. The electrical drive signals are fed into the high-frequency shielding chamber and to the light-emitting diodes via the coupling assembly.

Another application—likewise in the context of diagnostic MR devices—is to operate a high-frequency therapy device, whereby a high-frequency transmitter belonging to the therapy device is arranged outside the high-frequency shielding chamber. An antenna belonging to the therapy device is located inside the shielding chamber. The electrical line connection between transmitter and antenna occurs via the signal coupling assembly.

During the measuring sequence of the MR device the operation of the devices arranged inside the shielding chamber is interrupted and the leads are applied to ground potential. As soon as the measuring sequence is finished, the optical transmitter and the high-frequency therapy device can be reactivated by switching through the leads in the line coupling assembly.

Although modifications and changes may be suggested by those skilled in the art, it is the intention of the inventor to embody within the patent warranted hereon all changes and modifications as reasonably and properly come within the scope of his contribution to the art.

I claim as my invention:

1. A line coupling assembly for guiding electrical signals into a high-frequency shielded area, comprising:

a carrier plate composed of electrically insulating material having a first surface and a second surface disposed opposite said first surface;

a first electrically conductive layer disposed on said first surface;

a first line section disposed on said first surface electrically insulated from said first layer;

a second electrically conductive layer disposed on said second surface;

a second line section disposed on said second surface electrically insulated from said second layer;

a line segment proceeding through said carrier plate between said first surface and said second surface; and a first switch disposed on said first surface and a second switch disposed on said second surface, said first and second switches, in combination, forming switching means for, in a first switching state, electrically connecting said first layer to said second layer via said line segment and, in a second switching state, for electrically connecting said first line section to said second line section via said line segment.

2. A line coupling assembly as claimed in claim 1 wherein said first switch comprises a first relay having a switching contact electrically connected to said line segment and movable between said first layer and said first line section, and wherein said second switch comprises a second relay having a switching contact electrically connected to said line segment and movable between said second layer and said second line section.

3. A line coupling assembly as claimed in claim 1 further comprising optical signal transmitting means proceeding through said carrier plate from said first surface to said second surface, and wherein said second switch comprises actuator means for actuating said second switch dependent on an optical signal transmitted by said optical signal transmitting means.

4. A line coupling assembly as claimed in claim 1 further comprising a controller connected to a control bus electrically connected to each of said first switch and said second switch for supplying switching signals thereto.

5. A line coupling assembly as claimed in claim 1 wherein said carrier plate, said first and second conductive layers and said first and second line sections comprise a printed circuit board which is plated on each of said first surface and said second surface.

* * * * *